United States Patent [19]

Alcock

[11] Patent Number: 4,533,873
[45] Date of Patent: Aug. 6, 1985

[54] R.F. PHASE SHIFT CONTROL SYSTEM

[75] Inventor: Robert N. Alcock, Dorking, England

[73] Assignee: U.S. Philips Corporation, New York, N.Y.

[21] Appl. No.: 446,139

[22] Filed: Dec. 2, 1982

[30] Foreign Application Priority Data

Dec. 4, 1981 [GB] United Kingdom ................ 8136614

[51] Int. Cl.³ .......................................... H03H 11/20
[52] U.S. Cl. .................................... 328/155; 307/511;
307/516; 307/529; 307/262; 328/109; 328/133;
333/109
[58] Field of Search ..................... 307/510–514,
307/516, 529, 262; 328/55, 56, 109, 133, 155;
333/24.1, 109, 114

[56] References Cited

U.S. PATENT DOCUMENTS

| | | | |
|---|---|---|---|
| 4,215,314 | 7/1980 | Addor | 328/155 X |
| 4,290,022 | 9/1981 | Puckette | 328/109 X |
| 4,341,999 | 7/1982 | Rudish et al. | 307/511 X |
| 4,346,315 | 8/1982 | Roberts | 328/56 X |
| 4,358,741 | 11/1982 | Nardin | 328/155 X |
| 4,395,687 | 7/1983 | Belohoubek | 328/155 X |
| 4,445,099 | 4/1984 | Dixon | 333/24.1 |

OTHER PUBLICATIONS

Mariasingam, "A Precision Digital Phase Generator", IEEE Trans. Instr. and Msrmnt. vol. IM-23, No. 1, Mar. 1974, pp. 18–22.

Primary Examiner—Stanley D. Miller
Assistant Examiner—D. R. Hudspeth
Attorney, Agent, or Firm—Thomas A. Briody; William J. Streeter

[57] ABSTRACT

A system for amplifying R.F. signals with a selectable substantially constant phase at the output port (OP) relative to the input port (IP) comprises a phase shifter (PS) and an amplifier (AMP), a phase discriminator (PD) and a video processor (VP) which controls the phase shifter (PS) in accordance with the output of the phase discriminator (PD) and a phase selection signal (SEL). This signal (SEL) selects a bias voltage to cause the phase shifter to introduce a phase shift such that the relative phase at the output port is approximately equal to a desired value and also to select a monotonically varying error function which is derived from the phase discriminator and which is representative of the difference between the desired value and the actual value of the relative phase.

6 Claims, 8 Drawing Figures

R.F. PHASE SHIFT CONTROL SYSTEM

BACKGROUND OF THE INVENTION

This invention relates to a controlled-phase R.F. system comprising an input port, an output port, an R.F. amplifier for amplifying an R.F. signal supplied to the input port so as to provide a net gain greater than unity at the output port relative to the input port, a phase-shifter for introducing a controllable phase shift between the input port and the output port, and phase-control means comprising means for detecting a difference between the phase at the output port relative to the phase at the input port and an operational reference relative phase formed within the system, and for controlling the phase-shifter so as to tend to minimise said difference.

Such a system is known from U.K. Patent Specification No. 1 246 209. In this known system, the phase-difference detecting means comprises a phase quadrature detector, and the system is thus adapted to tend to maintain, substantially constant, a phase shift between the input port and the output port that has a single predetermined value corresponding to the condition of phase quadrature at the inputs of the phase detector.

It is desirable to provide an R.F. amplifier system which can give more than one value of substantially constant phase at the output port relative to the input port, particularly for use with a phased antenna array. When such an array is used for transmission, it is necessary to be able to control the respective phases of the R.F. energy supplied to each antenna element of the array relative to one another, and to be able to select each of the respective phases from a plurality of different values. It is an object of the invention to provide such a system.

SUMMARY OF THE INVENTION

According to the invention, a system as set forth in the opening paragraph is characterized in that the operational reference relative phase is selectable from a plurality of substantially different discrete values.

Suitably, in operation the phase-control means controls the phase-shifter with a control signal derived by addition of two quantities, a first of said quantities being a control quantity for causing the phase-shifter to introduce a predetermined phase shift (which may be zero) between the input port and the output port and the second quantity being an error function which is representative of said difference and which for small values thereof is a monotonically varying function. This can avoid a need to resolve ambiguities in the measurement of large phase angles.

The predetermined phase shift suitably is selectable so as to produce at the output port any one of a plurality of different relative phases spaced approximately at desired intervals, the operational reference relative phases being nominally, respectively, equal to said different relative phases. An error function need then represent substantially only phase inaccuracies resulting from deviations from a mean phase-shift in the network (due for example to the amplifier) and from a difference between a desired relative phase at the output port and the relative phase resulting from the relevant predetermined phase shift.

Suitably, the phase-control means comprises means for generating a plurality of error functions respectively representative of the difference between the relative phase at the output port and each of said substantially different discrete values for the operational reference relative phase, and further comprises means for selecting one of the error functions for controlling the phase-shifter.

To simplify selection of the appropriate operating parameters, the phase-control means may comprise means for adding to each of the error functions a respective control quantity such as to cause the phase-shifter to introduce a respective predetermined phase shift for producing at the output port a respective one of said plurality of different relative phases.

Suitably, the phase-control means comprises phase measurement means to produce two phase measurement quantities respectively representative of the sine and cosine of a measured phase angle which equals the difference between the relative phase at the output port and one of said substantially different discrete values for the operational reference relative phase, the plurality of error functions being derived from said two phase measurement quantities. Error functions associated with angles other than the measured angle and angles differing therefrom by an integral multiple of 90 degrees may then be derived in a simple manner by resistive combination of said two phase measurement quantities.

For binary digital phase selection, said substantially different discrete values for the operational reference relative phase suitably are spaced at intervals of $360/2^m$ degrees, where m is an integer such that $m \geq 3$. Embodiments in which $m=3$ or $m=4$ enable a significant number of different relative phases to be obtained without particular complexity.

Embodiments may readily be constructed for operation over a broad range of frequencies such as an octave.

The phase measurement means may comprise two phase comparison means each having two inputs, wherein a first pair of signals applied respectively to one input of each phase comparison means are of the same phase or are in antiphase, and wherein a second pair of signals applied respectively to the other input of each phase comparison means are in phase quadrature and are respectively derived from two outputs of a quadrature directional coupler.

It may be noted that an electrical phase shifting circuit wherein the phase difference between the output and input of the circuit can be selectively shifted from 0° to 180° is disclosed in U.S. Pat. No. 3,614,475. However, this circuit is not suitable for use at very high frequencies, and has no analogy at microwave frequencies. Moreover, the phase-control means operates on different principles. In the known circuit, the phase detector simply measures the phase at the output relative to the input (this relative phase having any value from 0° to 180°); the output voltage of the phase detector is a function of the relative phase (but is generally not directly proportional to the relative phase). The relative phase produced by the circuit is then wholly determined by the position of a wiper of a potentiometer connected across a potential difference, a voltage derived from the wiper being of opposite polarity to the output voltage of the phase detector and being used to approximately balance out the output voltage of the phase detector at an input of an operational amplifier controlling phase-shifting means. By contrast, in an embodiment of the present invention, the phase shifter is supplied with a control signal which is the sum of a selected bias voltage which will produce approximately the desired relative phase at the output and an error function which is derived from the phase detector and which is representative of the difference between the actual relative phase resulting from the application of the selected bias voltage and a corresponding selected operational reference relative phase representing the desired relative phase; the phase detector is thus always effectively operating close to a null condition.

DESCRIPTION OF THE DRAWINGS

Embodiments of the invention will now be described, by way of example, with reference to the diagrammatic drawings, in which.

DESCRIPTION OF THE PREFERRED EMBODIMENT

Figure 1:
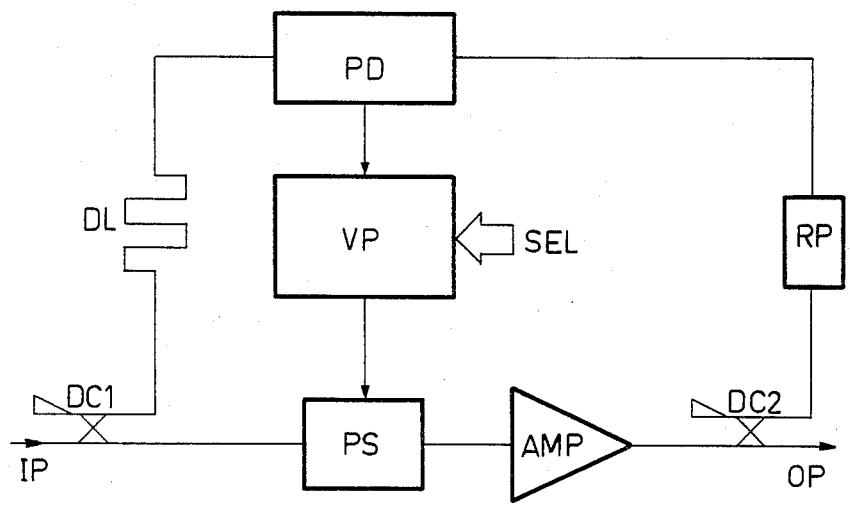
FIG. 1 is a circuit block diagram of a controlled-phase system embodying the invention.

Referring to FIG. 1, an R.F. network has an input port IP and an output port, OP and comprises in series therebetween a controllable phase shifter PS and an R.F. amplifier AMP which produces at the output port, relative to the input port a net gain that is greater than unity, i.e. after taking into account losses such as the insertion loss of the phase shifter PS. In order to obtain a selectable, substantially constant phase shift through the network, the system of FIG. 1 comprises a control loop for controlling the phase shifter PS. Small portions of the input and output signals of the network are derived by directional couplers DC1 and DC2, respectively, at the input port IP and the output port OP, and are coupled to two inputs of a phase discriminator PD, respectively, via a delay line DL and via a resistive pad RP. The output of the phase discriminator is connected to a video processor VP, to which a phase selection signal SEL is also supplied. The processor provides a control signal for the phase shifter PS so that the relative phase at the output OP of the network is at a substantially constant value determined by the phase selection signal SEL.

Figure 2:
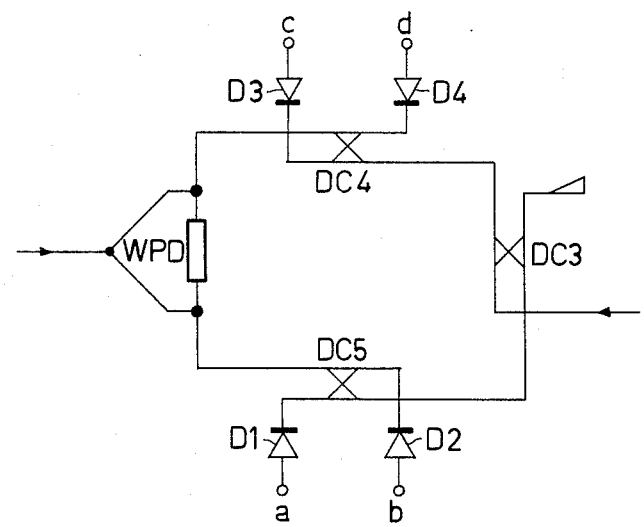
FIG. 2 shows a phase discriminator and FIG. 3 a video processor for the embodiment of FIG. 1.

The phase discriminator PD is shown in greater detail in FIG. 2. It comprises a Wilkinson power divider WPD and three 3 dB quadrature directional couplers DC3, DC4 and DC5, respectively. One input of the discriminator PD is coupled in the input arm of the divider WPD which provides in-phase signals of equal amplitude at its two output arms, and the other input of the discriminator is connected to one arm of coupler DC3. Another arm of coupler DC3, relatively isolated from the input arm, is terminated in a matched load, while the other two arms (which similarly are relatively isolated from one another) are connected by paths of equal length to one input arm of couplers DC4 and DC5, respectively. The other, relatively isolated, input arm of the latter two couplers DC4, DC5 are respectively connected by paths of equal length to the output arms of the Wilkinson power divider WPD, which output arms are mutually isolated by a resistive load therebetween. The other arms of directional couplers DC4 and DC5 are connected to detector diodes D1 to D4, respectively, which produce output signals at a, b, c, d, respectively, for video processing. This arrangement is analogous to one described in U.K. Patent Specification 1 385 111 (particularly with reference to FIG. 1) for operation as a frequency discriminator, the phase difference $\phi$ between the input signals to the discriminator in that case being a frequency-dependent angle determined by a fixed delay line.

Figure 3:
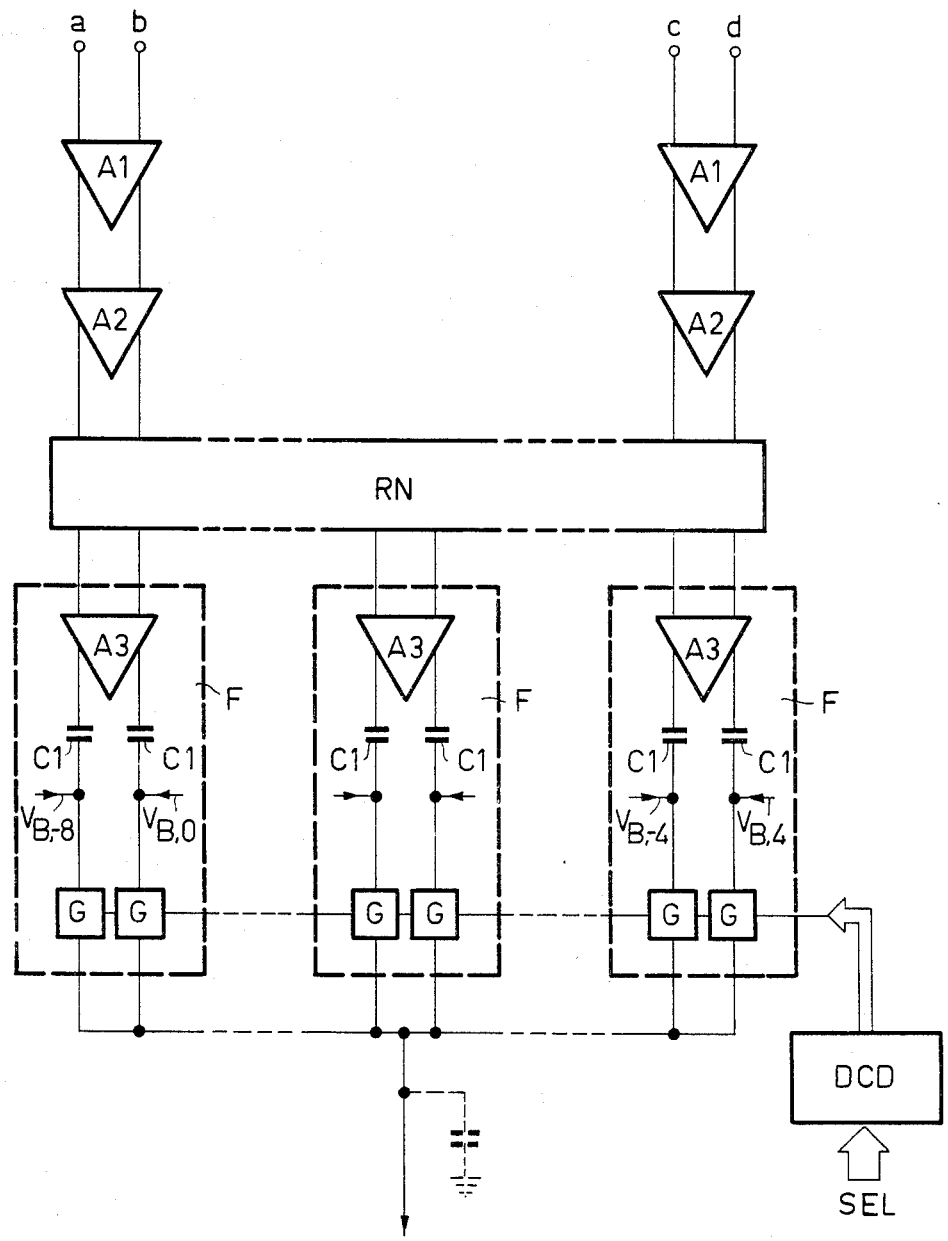
Figure 4:
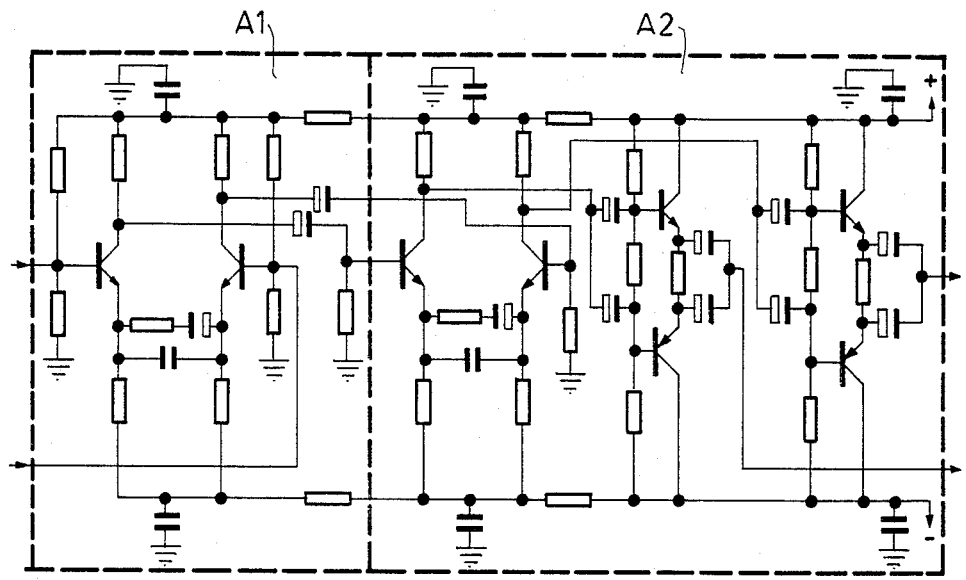
FIGS. 4 to 6 show parts of the video processor of FIG. 3 in greater detail, FIG. 4 being a circuit diagram of amplifier stages, FIG. 5 showing component parts of a resistive network and FIG. 6 being a circuit diagram of a further circuit block.

It can be shown that if the input signals to the phase discriminator PD are respectively of amplitude A and B and of phase zero and $\phi$, then are square-law detection by the diodes D1 to D4, the difference between the output signals a and b is proportional to $AB \sin \phi$ and the difference between the output signals c and d is proportional to $AB \cos \phi$. These subtractions are effectively performed in a first amplification stage A1 of the video processor which is shown in more detail in FIG. 3. This comprises two channels for the signals from a, b and c, d, respectively, preceding a resistive network RN; each channel comprises successive push-pull amplification stages A1 and A2. FIG. 4 is a circuit diagram of suitable circuitry for the stages A1 and A2. As shown, each stage comprises a long-tailed pair, that of A2 being followed by a complementary emitter follower to drive the resistive network RN.

Figure 5:
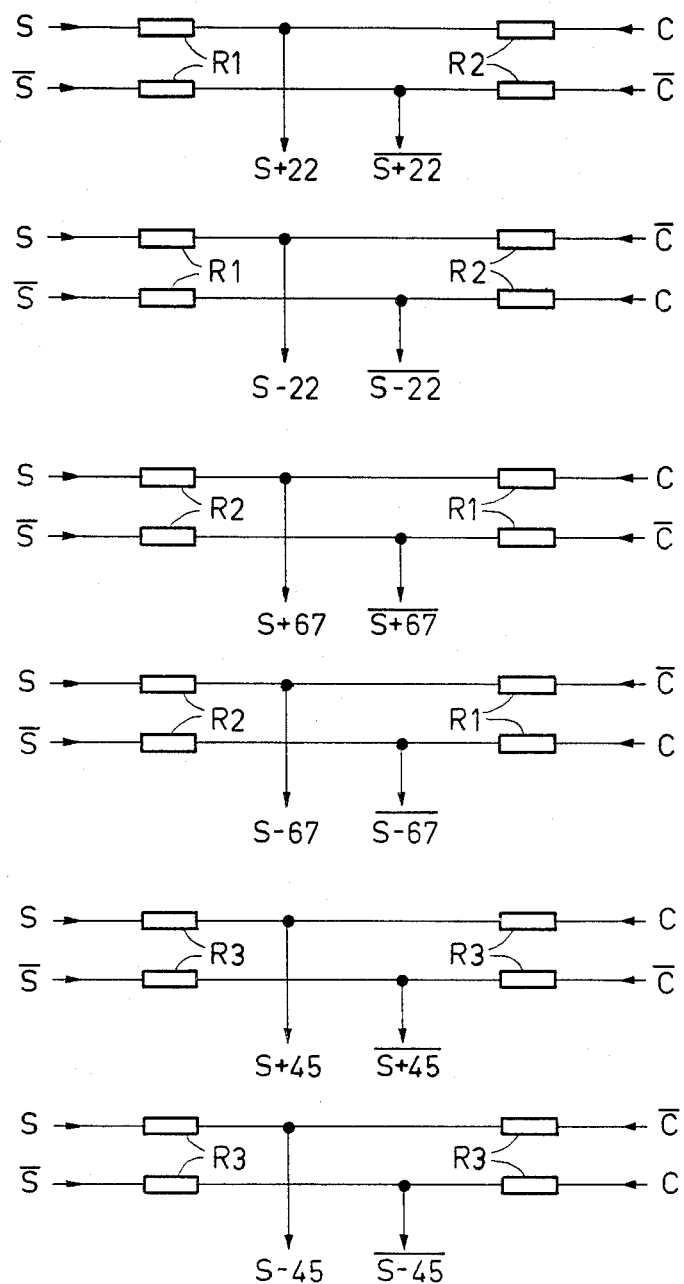

The two channels produce pairs of signals directly proportional to the trigonometric variables $\sin \phi$, $-\sin \phi$ and $\cos \phi$, $-\cos \phi$, which can collectively be written as $\sin (\phi + p.90)$ where p is an integer such that $-2 \leq p \leq 1$. The four trigonometric variables can therefore be considered as four error functions, respectively representing the difference between the relative phase at the output port and four operational reference relative phases spaced at intervals nominally of 90 degrees. (In practice, deviations from the ideal case just considered may cause the intervals to differ slightly from 90 degrees). In order to obtain further error functions associated with more closely spaced angles, the four signals from the two channels are resistively combined pairwise in the network RN in twelve different ways according to the relationships $\sin \phi + k \cos \phi = \nu(1+k^2) [\sin (\phi + \arctan k)]$ $k \sin \phi + \cos \phi = \nu(1+k^2) [\sin (\phi + \arctan (1/k))]$ and similarly for $-\sin \phi$, $-\cos \phi$, where k has one of the four values $+1$ and $+(\nu 2 - 1)$. This is illustrated in FIG. 5, in which the input and output signals are indicated by the notation S for $\sin \phi$, C for $\cos \phi$, $\overline{S}$ for $-\sin \phi$, S+45 for $\sin (\phi + 45)$, S+22 for $\sin (\phi + 22\frac{1}{2})$, etc. The resistances R1 and R2 are selected so that $R2/R1 = \nu 2 - 1$, and R3 may be selected to be approximately $(R1+R2)/2$ so as to provide approximately the same loading. The output signals are then obtained in accordance with the equations $$\sin \emptyset \pm (\sqrt{2} - 1) \cos \emptyset = \pm k_1 \sin (\emptyset \pm 22\tfrac{1}{2})$$

$$(\sqrt{2} - 1) \sin \emptyset \pm \cos \emptyset = \pm k_1 \sin (\emptyset \pm 67\tfrac{1}{2})$$

$$\sin \emptyset \pm \cos \emptyset = \pm k_2 \sin (\emptyset \pm 45)$$

and similarly for $-\sin \phi$, $-\cos \phi$, where $k_1$ is approximately 1.4 and $k_2$ is approximately 1.08. Together with the four input signals to RN (which are also used unchanged), this gives a total of sixteen signals which are collectively of the form $$\sin(\phi + n.22\tfrac{1}{2})$$

where n is an integer such that $-8 \leq n \leq +7$. In other words, the trigonometric variables in these output signals may be considered as sixteen error functions, respectively, representing the difference between the relative phase at the output port and sixteen different discrete values for the operational reference relative phase spaced at intervals nominally of $22\tfrac{1}{2}$ degrees.

The sixteen signals are fed pairwise to eight further circuit blocks F. In these blocks F, the signals are first amplified pairwise by a further push-pull amplifier stage A3. A respective bias voltage $V_{B,n}$ is then added to each signal, the bias voltage being D.C.-isolated from the amplifier output by a respective capacitor C1.

The bias voltages are control quantities such that, in the absence of the error function, they each cause the phase shifter PS to introduce between the input port IP selection control bit supplied to a respective enable input E.

Figure 7:
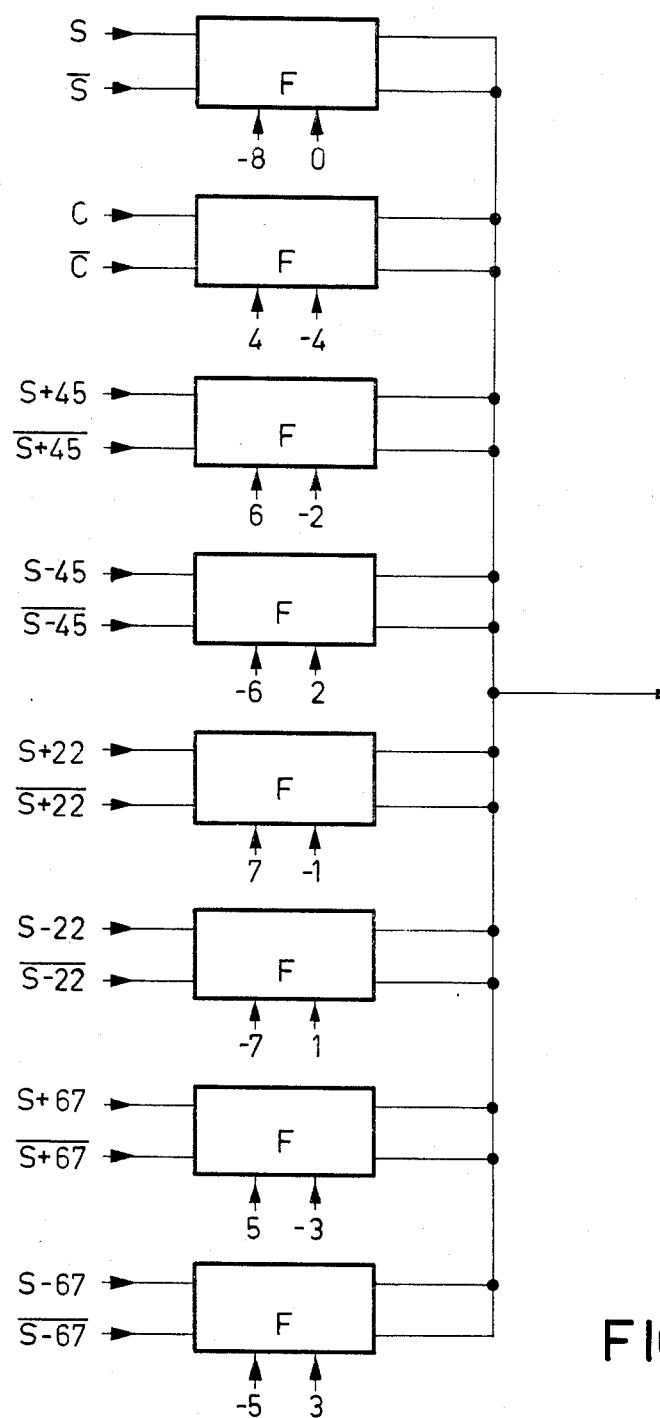
FIG. 7 shows connections to the further circuit blocks.

FIG. 7 shows (with the same notation as for FIG. 5) the input signals to the eight circuit blocks F and the interconnection of their outputs. (The blocks are controlled so that at any one time, there is only a single output signal.) The two digits respectively associated in FIG. 7 with the selection control bits for the gates in each block are the appropriate values of n, the left-hand digit relating to the control bit for the upper input signal and the right-hand digit relating to the control bit for the lower input signal.

The Table below is a truth table for the operation of the decoder DCD. It shows for each of the 16 different values for the operational reference relative phase ("Phase") the trigonometric variable of the error function ("Error Signal"), the four-bit word of the phase selection signal SEL ("SEL word"), and the 16 bits produced by the decoder DCD ("Control bits") in which all control bits not shown are zero, the value of n associated with each bit being indicated across the top of the column.

TABLE

| Phase | Error Signal | SEL Word | Control bits. Value of n:- | | | | | | | | | | | | | | | |
|---|---|---|---|---|---|---|---|---|---|---|---|---|---|---|---|---|---|---|
| | | | −8 | −7 | −6 | −5 | −4 | −3 | −2 | −1 | 0 | 1 | 2 | 3 | 4 | 5 | 6 | 7 |
| −180 | S | 0000 | 1 | | | | | | | | | | | | | | | |
| −157½ | S−22 | 0001 | | 1 | | | | | | | | | | | | | | |
| −135 | S−45 | 0010 | | | 1 | | | | | | | | | | | | | |
| −112½ | S−67 | 0011 | | | | 1 | | | | | | | | | | | | |
| −90 | $\overline{C}$ | 0100 | | | | | 1 | | | | | | | | | | | |
| −67½ | $\overline{S+67}$ | 0101 | | | | | | 1 | | | | | | | | | | |
| −45 | $\overline{S+45}$ | 0110 | | | | | | | 1 | | | | | | | | | |
| −22½ | $\overline{S+22}$ | 0111 | | | | | | | | 1 | | | | | | | | |
| 0 | $\overline{S}$ | 1000 | | | | | | | | | 1 | | | | | | | |
| 22½ | $\overline{S-22}$ | 1001 | | | | | | | | | | 1 | | | | | | |
| 45 | $\overline{S-45}$ | 1010 | | | | | | | | | | | 1 | | | | | |
| 67½ | $\overline{S-67}$ | 1011 | | | | | | | | | | | | 1 | | | | |
| 90 | C | 1100 | | | | | | | | | | | | | 1 | | | |
| 112½ | S+67 | 1101 | | | | | | | | | | | | | | 1 | | |
| 135 | S+45 | 1110 | | | | | | | | | | | | | | | 1 | |
| 157½ | S+22 | 1111 | | | | | | | | | | | | | | | | 1 | and the output port OP a respective predetermined phase shift for producing at the output port a respective one of a plurality of different relative phases spaced approximately at the desired intervals of $22\tfrac{1}{2}$ degrees. The sixteen signals resulting from the addition of the respective error functions and control quantities are supplied to a 16-pole selector switch, by means of which one of the sixteen signals is selected to be supplied to the phase shifter PS for controlling the phase shift. In this embodiment, the selector switch is formed by sixteen FET gating devices G, any one of which can be switched on by a respective one of 16 selection control bits from a decoder DCD that operates on the phase selection signal SEL, the latter having in this case 4 bits.

Figure 6:
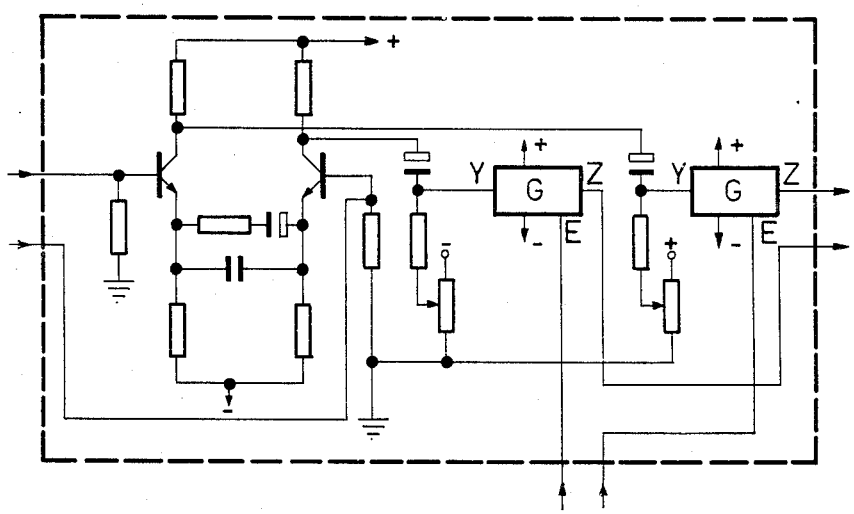
Figure 8:
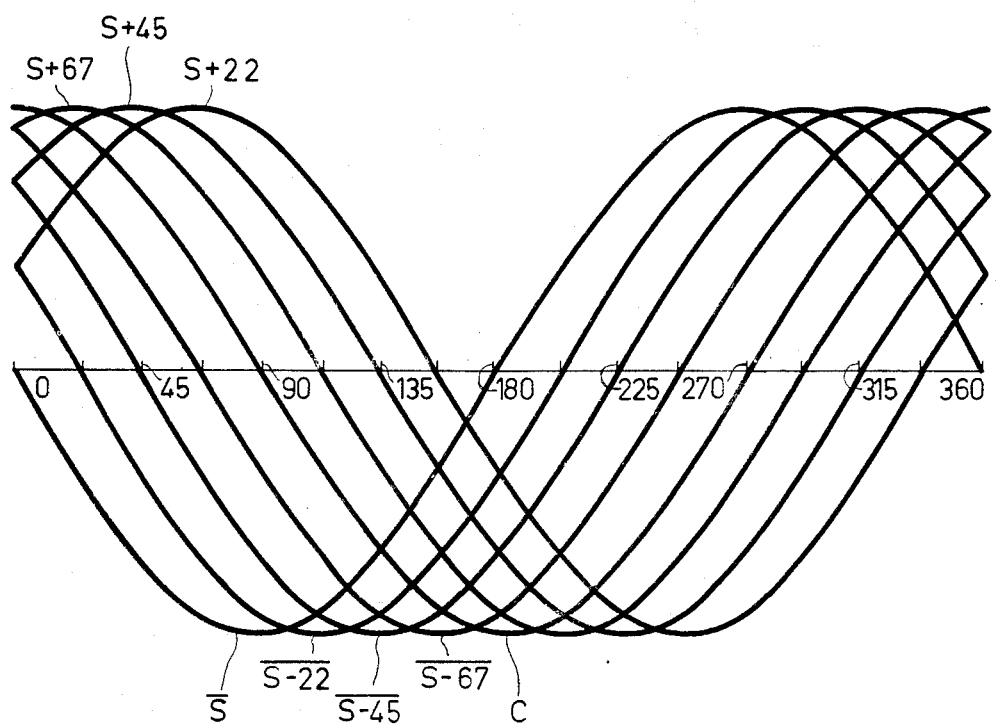
FIG. 8 is a graph of some control signals from the video processor.

FIG. 6 is a circuit diagram of a suitable form of the further circuit block F. As with the amplifier stages A1 and A2, the amplifier stage A3 comprises a long-tailed pair. Each bias voltage $V_{B,n}$ is derived from a respective potentiometer POT supplied with one of two predetermined voltages appropriate to the phase shift/bias voltage characteristic of the phase shifter PS. Each of the two gates G has an input Y and an output Z, the impedance between which is controlled by a respective FIG. 8 is a graph of eight of the trigonometric variables of the error functions (those in the lower half of the above Table) as a function of $\phi$. (The other eight are mirror images, about the horizontal ($\phi$) axis, of those shown.) From the graph, it will be appreciated that each error function is, over a range of $\pm 90$ degrees about the value of $\phi$ at which the function is zero, a monotonic function of the difference between $\phi$ and that value, i.e. of the difference between the relative phase at the output port and a respective one of the different values for the operational reference relative phase.

In this embodiment, the delay line DL is included in the connection from the directional coupler DC1 to one input of the phase discriminator PD so that the effective electrical path length to that input from the input port IP via the delay line substantially equals the effective electrical path length from the input port IP via the phase-shifter PD, R.F. amplifier AMP, directional coupler DC2, and resistive pad RP to the other input of the phase discriminator. This eliminates phase variations with frequency due to path-length effects, and is necessary if the system is to perform consistently over a range of frequencies. To attain this condition, the phase shifter is set in a reference state: with a varactor phase shifter, this may suitably be zero bias voltage (i.e. zero control signal), which may be taken to give a predetermined phase shift of zero. The delay line, which is initially too long, is trimmed until there is substantially no change in the outputs of the discriminator as the frequency is varied over the operating range.

The resistive pad RP is adjusted so that the amplitudes of the signals at the two inputs of the phase discriminator are approximately equal. This is not essential since the magnitudes of the signals from amplifier stages A1 in each channel are ideally directly proportional to the amplitudes A, B of the input signals to the discriminator, and therefore altering A or B should merely alter the loop gain; however, approximately equalizing A and B will tend to reduce errors due to asymmetry or imbalance in the discriminator or video processor.

An analysis of a system embodying the invention, such as that described above with reference to the drawings, indicates that the phase error under normal (closed-loop) operating conditions is the sum of two terms. One term is the phase error due to imperfections in the phase discriminator and video processor, and is the difference between a desired relative phase at the output port and the relevant operational reference relative phase; the other term is the phase error that would exist under open-loop conditions, due to for example the amplifier and inaccurate setting of the bias voltage for the phase-shifter, divided by a factor of (1+loop gain).

An embodiment of the form described above has been constructed for operation in the band of 3.0–3.5 GHz. The microwave transmission path between the input and output ports, including the directional couplers DC1 and DC2, was formed in coaxial line. The phase-shifter PS was type PQ 45 manufactured by Triangle Microwave, Inc. (a U.S. company), a broadband varactor phase shifter designed to operate over the band of 2–4 GHz. The phase discriminator PD was formed in microstrip on alumina. The directional couplers DC3, DC4 and DC5 were of the Lange type; the detector diodes D1–D4 were chip devices, and the bias current of each diode, provided by the amplifier stage A1, was about 120 $\mu$A.

In order to minimize the transient that occurs when the relative phase changes (either because of a variation in an element of the network, such as the amplifier, or because a different phase is selected), it is desirable that the response time of the control loop should be small and hence that the group delay of the video processing should be minimized. For this reason, the video circuitry is push-pull throughout, as described above, since this provides the maximum gain for a given stage delay. The transistors used in the long-tailed pair in each of the amplifier stages A1, A2 and A3 are type BF 494, chosen because of their low group delay. The two transistors of the complementary emitter follower included in amplifier stage A2 (FIG. 4) to drive the resistive network RN are respectively types BF 494 and BF 324. The two gates G in circuit block F (FIG. 6) form half of an IC type HEF 4066B. The decoder DCD comprises a decoder type SN 74154N whose outputs are inverted by three ICs type 7406. The values of the resistances R1, R2, R3 in the resistive network RN are 470, 1133 and 820 ohms respectively, the resistors having a tolerance of 1%.

The characteristics of parts and the whole of the constructed system were examined. The insertion loss, VSWR, and the phase shift for a given bias voltage of the phase-shifter were found to vary across the operating frequency band, the insertion loss varying between 3.5 and 4.5 dB, and the VSWR having a maximum value of 1.35; taking the phase shift at zero bias to be zero for reference, as mentioned above (this was at about the centre of the obtainable range of phase shifts), the change of phase shift with frequency was particularly marked for the most negative bias voltages (giving the most negative phase shifts).

The deviation from nominal equality of each of the different desired relative phases at the output port and the respective operational reference relative phases, due to the phase discriminator and the video processor, was measured at six different frequencies spaced across the operating band. This was done by determining with a calibrated line, the value of the phase difference that had to be introduced between the input signals to the phase discriminator in order for the appropriate error function (selected by SEL) at the output of the video processor to be zero (with no bias voltage applied). It was found that the mean error was zero, the standard deviation was 2.5 degrees, and the peak error was 5.1 degrees.

The closed-loop steady-state error at the same six frequencies was determined (again with the aid of the calibrated line) in a system comprising the phase-shifter but not an amplifier, the phase-shifter being controlled by a loop comprising the phase discriminator and the video processor. First, with the phase discriminator disconnected, the bias voltages were set so that the phase-shifter produced phase shifts spaced at the desired intervals of 22$\frac{1}{2}$ degrees at one of the six frequencies (3.34 GHz). The phase discriminator was then connected to close the control loop, and the errors were measured. The mean error was now −0.3 degrees, the standard deviation was 3.1 degrees, and the peak error was 7 degrees. Comparison of these figures with the errors due to the phase discriminator and video processor shows consistency with the above-mentioned analysis: the phase error under closed-loop conditions is predominantly that of the discriminator and video processor.

The loop gain was determined at each of the phase settings by measuring, under open-loop conditions, the rate of change with bias voltage $V_B$ of the control signal at the output of the video processor in the region of a null in the control signal. The gain was found to vary between about 20 and 140, being smallest for large positive phase shifts and generally increasing as the phase shift was reduced (i.e. changed towards large negative values). This variation is thought to be predominantly due to the phase shift/bias voltage characteristic of the phase shifter, which was separately measured to be generally markedly non-linear, the slope increasing as the bias voltage decreased; variations in the phase shifter mismatch may additionally cause some local changes in the separately measured characteristic when the phase shifter is operating in the system. The variation in loop gain can, if desired, be reduced by varying the gains of amplifier A3 in appropriate circuit blocks F.

The embodiment described with reference to the drawings is suitable for pulsed but not continuous R.F. signals, as the circuitry of the video processor is A.C.-but not D.C.-coupled. The embodiment may be modified for CW signals either by using D.C.-coupled circuitry or by chopping the input signals to the phase discriminator with PIN diode switches and introducing a sample-and-hold circuit block between the output of the video processor and the phase shifter to maintain the control signal at approximately the correct value in the intervals between pulses.

The transient performance of the constructed embodiment was examined by displaying the control signal at the output of the video processor on an oscilloscope. The performance of the video processor alone was first determined by applying a single input signal to it: the video gain was about 1000, the group delay was 40 ns, and the risetime was 90 ns. With a pulse signal, there was a linear rise and an exponential decay. Applying a pulsed R.F. signal to the input port IP under closed-loop conditions, with a pulse duration of 10 $\mu$s and producing an error voltage at the output of the video processor of 100 mV, the risetime was 140 ns and the falltime 2 $\mu$s. It was found that at high loop gains, a sinusoidal ripple of 20 MHz frequency developed: this could be eliminated with a capacitor of 4700 pF shunting the output of the video processor, as shown in dashed lines in FIG. 3, at the expense of increasing the rise and fall times to 500 ns and 10 $\mu$s, respectively. A better compromise could be obtained by switching out the shunt capacitor during phase transitions with a 2 $\mu$s clock pulse operating a FET switching device.

As the phase-shifter and the phase discriminator of the described constructed system were both designed to operate over the range of 2-4 GHz, the performance of the system should be generally the same over the whole of that range.

In systems embodying the invention, the transmission path between the input and output ports may comprise further circuit elements, and in particular the control loop may be used to reduce variations with time in the net relative phase at the output port due to contributions from other circuit elements with time-varying characteristics, such as circulators.

I claim:

1. A controlled-phase R.F. system comprising an input port, an output port, an R.F. amplifier for amplifying an R.F. signal supplied to the input port so as to provide a net gain greater than unity at the output port relative to the input port, a phase-shifter for introducing a controllable phase shift between the input port and the output port, and phase-control means including means for generating within the system a plurality of signals corresponding respectively to selected operational reference relative phases, means for selecting individually said operational reference relative phases, means for detecting a difference between the phase at the output port relative to the phase at the input port and relative to a selected operational reference relative phase, and for controlling the phase-shifter so as to tend to minimize said difference relative to said selected one of said operational reference relative phases, said selected operational reference relative phases being selectable from a plurality of substantially different discrete values, whereby to provide a selectable substantially constant phase shift from the input port to the output port, a predetermined phase shift being selectable so as to produce at the output port any one of said plurality of different relative phases spaced approximately at desired intervals, the operational reference relative phases being nominally respectively equal to said different relative phases, in operation, the phase-control means controls the phase-shifter with a control signal derived by addition of two quantities, a first of said quantities being a control quantity for causing the phase-shifter to introduce a predetermined phase shift between the input port and the output port and the second quantity being an error function representative of said difference and, for small values thereof, being a monotonically varying function, said phase control means further includes means for generating a plurality of error functions, respectively representative of the difference between the relative phase at the output port and each of said substantially different discrete values for the operational reference relative phase, and further includes means for selecting one of the error functions for controlling the phase-shifter.

2. A system as claimed in claim 1 wherein the phase-control means comprises means for adding to each of the error functions a respective control quantity such as to cause the phase-shifter to introduce a respective predetermined phase shift for producing at the output port a respective one of said plurality of different relative phases.

3. A system as claimed in claim 1 wherein the phase control means comprises phase measurement means to produce two phase measurement quantities, respectively representative of the sine and cosine of a measured phase angle which equals the difference between the relative phase at the output port and one of said substantially different discrete values for the operational reference relative phase, and wherein the plurality of error functions are derived from said two phase measurement quantities.

4. A system as claimed in claim 3 wherein error functions associated with angles other than the measured phase angle and angles differing therefrom by an integral multiple of 90 degrees are derived by resistive combination of said two phase measurement quantities.

5. A system as claimed in claim 3 wherein said substantially different discrete values for the operational reference relative phase are spaced at intervals of substantially $360/2^m$ degrees, where m is an integer such that $m \geq 3$.

6. A system as claimed in claim 3 wherein the phase measurement means comprises two phase comparison means each having two inputs, wherein a first pair of signals applied respectively to one input of each phase comparison means are of the same phase or are in antiphase, and wherein a second pair of signals applied respectively to the other input of each phase comparison means are in phase quadrature and are respectively derived from two outputs of a quadrature directional coupler.

* * * * *